United States Patent [19]
Chan et al.

[11] Patent Number: 5,468,967
[45] Date of Patent: Nov. 21, 1995

[54] DOUBLE REFLECTION CATHODOLUMINESCENCE DETECTOR WITH EXTREMELY HIGH DISCRIMINATION AGAINST BACKSCATTERED ELECTRONS

[75] Inventors: Daniel S. H. Chan; Kin Leong; Jacob C. H. Phang, all of Singapore, Singapore

[73] Assignee: National University of Singapore, Singapore

[21] Appl. No.: 295,048

[22] Filed: Aug. 26, 1994

[51] Int. Cl.⁶ .................................................. H01J 37/244
[52] U.S. Cl. ........................................ 250/397; 250/310
[58] Field of Search .................................. 250/397, 310, 250/306

[56] References Cited

U.S. PATENT DOCUMENTS

| | | | |
|---|---|---|---|
| 3,790,781 | 2/1974 | Horl et al. | 250/310 |
| 4,900,932 | 2/1990 | Schäfer et al. | 250/397 |
| 5,264,704 | 11/1993 | Phang et al. | 250/347 |

FOREIGN PATENT DOCUMENTS

| | | |
|---|---|---|
| 373656 | 6/1990 | European Pat. Off. . |
| 982117 | 12/1982 | U.S.S.R. . |

OTHER PUBLICATIONS

J. Marek, R. Geiss, L. M. Glassman and M. P. Scott, "A Novel Scheme for Detection of Defects in III–V Semiconductors by Cathodoluminescence," Journal Electrochemistry Society, vol. 132, 1985, pp. 1502–1504.

A. Boyde and S. A. Reid, "A new method of scanning electron microscopy for imaging biological tissues", Nature, vol. 302, 1983, pp. 322–323.

*Primary Examiner*—James Beyer
*Assistant Examiner*—James Beyer

[57] ABSTRACT

A parabolic reflector and an inclined planar light reflector in a cathodoluminescence detector are integrated with a set of photo-sensitive solid-state detector cells mounted in quadrature on a supporting plate, and supported by an electron microscope vacuum chamber specimen stage adaptor unit. Designed for CL emission operation in an electron microscope, the parabolic light reflector, the inclined planar light reflector and the photo-sensitive, solid-state detector cells are optically aligned and mechanically combined through the supporting plate of the detector cells. A readily exchangeable unit is thus obtained. The unit is further supported by the specimen stage adaptor unit so as to obtain a mechanical unit which can easily be mounted in and removed from any standard electron microscope vacuum chamber stage as a single integrated unit.

14 Claims, 2 Drawing Sheets

DOUBLE REFLECTION CATHODOLUMINESCENCE DETECTOR WITH EXTREMELY HIGH DISCRIMINATION AGAINST BACKSCATTERED ELECTRONS

FIELD OF THE INVENTION

This invention relates generally to a cathodoluminescence detector and more particularly to a cathodoluminescence detector having a relatively high signal to noise ratio and improved efficiency in screening stray cathodoluminescence signals generated by backscattered electrons.

BACKGROUND OF THE INVENTION

While cathodoluminescence (CL) detectors are generally known, in CL detectors using a solid-state detector as the detection element, the photodiodes are positioned inside the electron microscope vacuum chamber close to the beam impact point. A glass cover is normally placed in front of the solid-state detector to protect it from energetic backscattered electrons that can also contribute to the detector signal. However, the glass cover in front of the solid-state detector is actually a powerful CL emitter and acts as an extremely efficient converter of backscattered electrons to light which would be detected by the solid-state photodiode. The total signal detected bears little or no relationship to the CL signal generated by the specimen under observation.

A high efficiency detector providing discrimination against backscattered electrons is disclosed in U.S. Pat. No. 5,264,704 being issued to J. C. H. Phang et al, the present inventors, on Nov. 23, 1993. In this patent, a parabolic light reflection device is combined with a photo-sensitive solid state detection device which can easily be mounted and removed from the vacuum chamber specimen stage of an electron microscope. The detector additionally includes a generally flat photosensitive element mounted on a flat supporting plate in the same plane as the specimens under investigation so that backscattered electrons from the specimen will not strike the photosensitive area of the photosensitive element and will be effectively absorbed by the parabolic light reflector.

Although the detector apparatus described in U.S. Pat. No. 5,264,704 overcomes some of the limitations existing in the prior art, when using gallium arsenic semiconductor as a specimen, as much as 6% of the electrons from the primary beam can still reach the photo-sensitive detection element. This has been found to be undesirable for quantitative cathodoluminescence measurements.

SUMMARY

Accordingly, it is the primary objective of this invention to reduce and minimize the backscattered electron disturbance during the operation of a cathodoluminescence detector.

It is another object of this invention to provide a detector which can easily be mounted and removed as an integral unit from a vacuum chamber specimen stage of an electron microscope.

Briefly, the foregoing and other objects are achieved by a double reflection cathodoluminescence detector comprising a parabolic light reflector, an inclined planar light reflector, a set of photo-sensitive solid-state detectors mounted on a supporting plate for receiving radiation emitted from a specimen and an electron microscope vacuum chamber specimen stage adaptor unit for near infrared and infrared investigation of cathodoluminescent specimens, especially semiconductor luminescent materials and devices under the irradiation of an electron beam which is generated by an electron emitter. The parabolic reflector first receives the radiation emitted from the specimen and then directs it to the planar reflector. Backscattered electrons are collected for removal by both the parabolic and planar reflectors.

BRIEF DESCRIPTION OF THE DRAWINGS

The invention will be more readily understood when considered in conjunction with the accompanying drawings wherein.

DETAILED DESCRIPTION OF THE INVENTION

Figure 1:
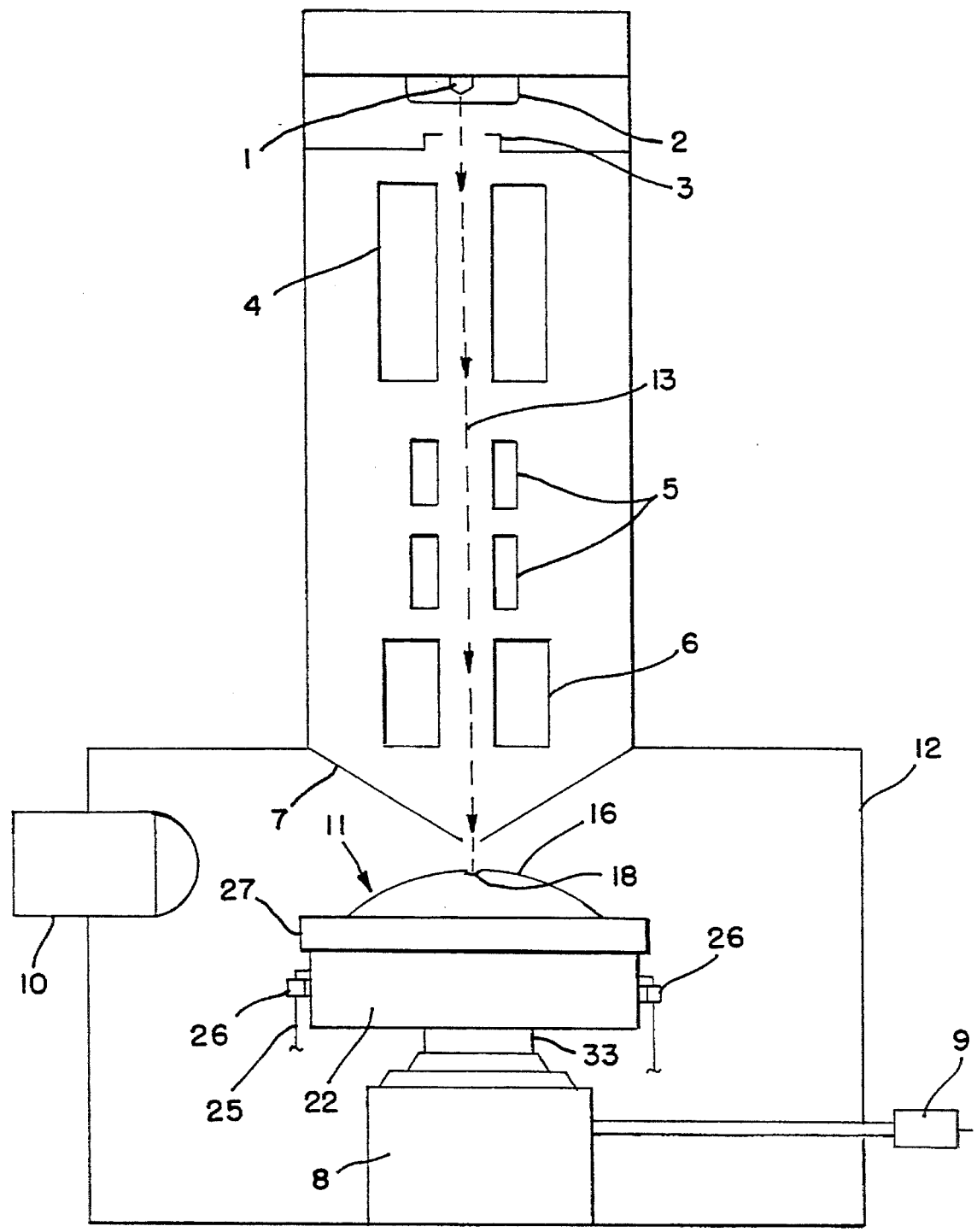
FIG. 1 schematically discloses an electron microscope including a cathodoluminescence detector in accordance with the subject invention.

Referring now to the drawings wherein like reference numerals refer to like parts, an electron microscope is shown in FIG. 1 comprising an electron emitter or cathode 1, a Wehnelt cylinder electrode 2, an anode 3, a beam adjustment system 4, a beam scanning system 5, a final lens 6, a lower pole piece 7 of the final lens, a specimen stage 8 with its adjustment device 9, an electron detector 10 and a cathodoluminescence detector 11 in accordance with this invention. All elements are located in an electron microscope housing 12.

Figure 2:
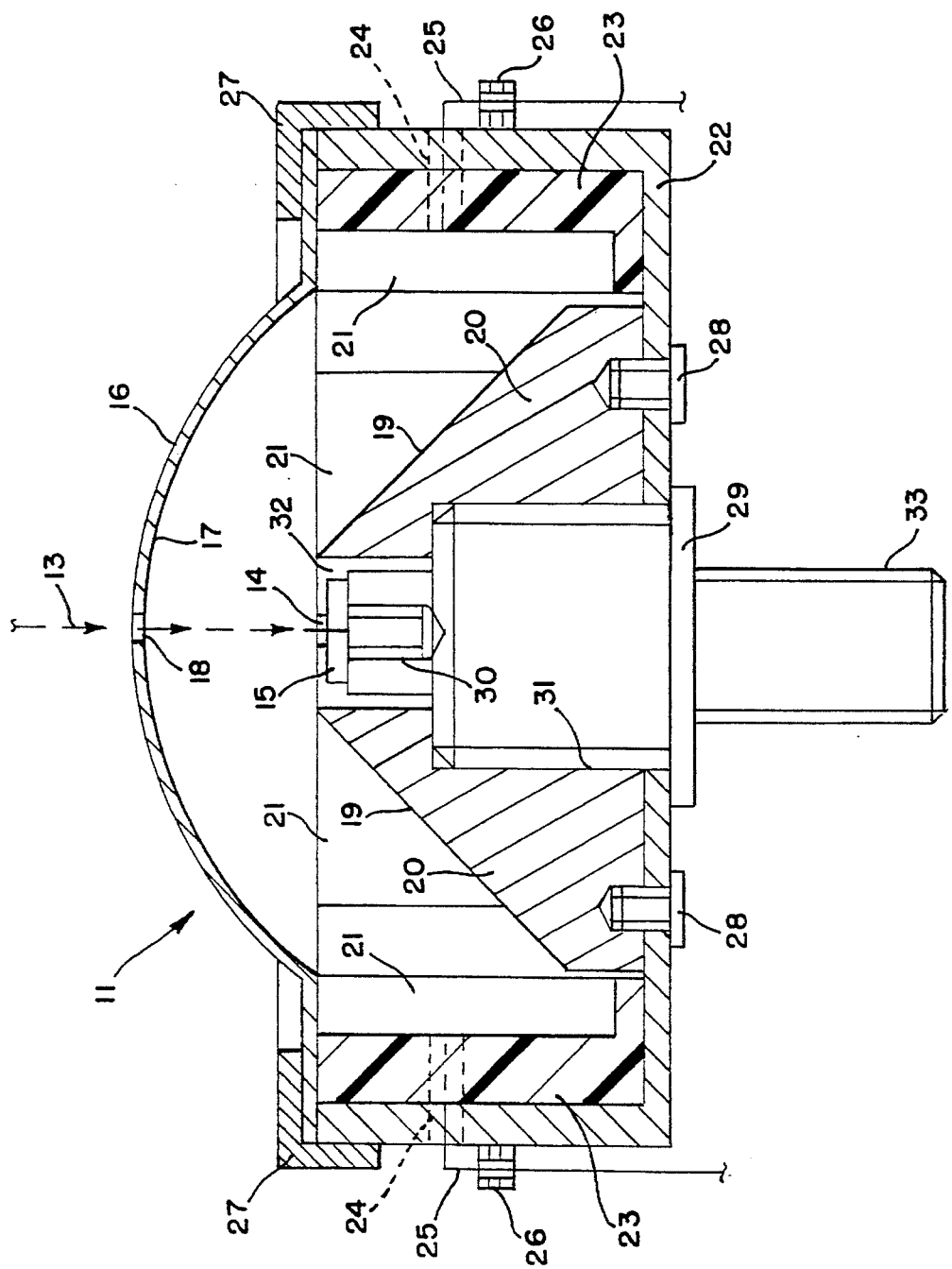
FIG. 2 is a central transverse cross section illustrating the details of the cathodoluminescence detector shown in FIG. 1.

In normal operation of the electron microscope, an electron beam 13 emitted by the cathode 1 irradiates a specimen 14, shown in FIG. 2, arranged on a specimen stub 15 so that radiation due to interaction with the specimen can be detected. The specimen 14 is scanned by the electron beam 13. Transmitted, reflected and/or secondary electrons or other radiations generated by the interaction between the electron beam 13 and the specimen 14 are typically detected by detection apparatus shown by reference numeral 10, to which a video monitor system, not shown, is connected. The detection apparatus 10, however, plays no part in the subject invention, the details of which will now be described.

In FIG. 2, a parabolic light reflector 16 is shown 10 having a shiny interior concave surface 17 for light reflection. This can be achieved by either a coating of a thin film of aluminum on a parabolic cup, a fine surface finish on an aluminum parabolic cup, or an industrial grade piece of aluminum foil formed in the shape of a parabolic mirror with the shiny side acting as its reflective surface. A central opening 18 is provided on top of the reflector 16 for the passage of the scanning electron beam 13 therethrough.

Four 45° highly polished surfaces 19, each occupying one side of a truncated square base aluminum pyramid type reflector 20, are positioned so as to reflect the backwardly reflected light from the parabolic light reflector 17. A photosensitive detector assembly comprising four small detector cells 21 which consist of solid state sensitive devices positioned vertically with each active area of the solid state devices 21 respectively facing one of the four inclined surfaces 19. The detector cells 21 are supported by an electrically conductive cell holder 22 by means of an electrically intermediate insulating member 23. Small openings 24 are provided in both the cell holder 22 and the insulating member 23 through which shielded electrical wires 25 carrying the detected signals are coupled to an amplifying circuit, not shown. The wires 25 are secured and held in position by means of a clamp/screw arrangement 26. The parabolic light reflector 16, the inclined planar light reflector 20 and the cell holder 22 are rigidly held together by means of a peripheral clamp 27 and screw type hardware 28, so as to form a mechanically integrated unit.

The top opening 18 in the parabolic reflector 17 is usually a circle of about 5mm in diameter, the inclined planar light reflector 20 and the photodevices 21 are concentric with respect to the optical axis. This type of mounting results in the specimen being positioned exactly at the focus of the parabolic light reflector 16 and cathodoluminescence emission will be automatically guided therefrom to the four detector cells 21 by the inclined planar surfaces 19 of the pyramidal reflector 20.

Also included is a specimen stage adaptor unit 29 which is a specially machined specimen holder and is provided with a threaded hole 30 into which the specimen stub 15 can be tightened. The specimen stage adaptor unit 29 and the combined assembly of the parabolic light reflector 16, the inclined planar light reflector 20, and the photo-sensitive cells 21 are interconnected by means of the screw threaded hole 31 on the inclined planar light reflector 20. A through hole 32 in the reflector 20 permits the specimen 14 to face the incoming electron beam 13. An integrated unit is thus obtained. This configuration, moreover, results in forming a suitably electrically conductive path for electron discharge. Should backscattered electrons be collected by the electrically conductive parabolic 16 or the inclined planar reflector 20, they can be discharged to the electronic microscope ground through the same discharge path so that charging problems are eliminated. The entire unit thus formed can be installed in an electron microscope vacuum chamber housing 12 by a single threaded stud 33.

In the embodiment disclosed herein, the adaptation of the invention to any standard electron microscope will not require any modification. The mounting and dismounting of the cathodoluminescence apparatus in the 10 described manner will be effectively similar to that for a normal specimen loading or exchange operation. The loading and unloading of the specimen 14 can be realized simply by removing the assembly including the parabolic light reflector 16, the inclined planar light reflector 20, and the photo-sensitive cells 21 from the specimen stage adaptor unit 29. It should be noted that in this configuration the entire unit including the specimen 14 moves together during adjustment. The optical alignment will thus not be a problem once it is adjusted during the assembly stage.

Thus the present invention further reduces and minimizes the backscattered electron disturbance during CL operation. One of the main features is that cathodoluminescence rays have to undergo two light reflections, one at the parabolic light reflector 16 and the other at the inclined planar light reflector 20 before being detected by the photo-sensitive solid-state detector cells 21. Accordingly, electrons from the primary beam 13 have to undergo at least two scattering events before it can cause disturbance to the detector cells 21. Since the photo-sensitive, solid-state detector cells 21 are positioned vertically at the same level or slightly below the top surface of the specimen 14 and facing the inclined surfaces 19, backscattered electrons from the specimen will not strike the photo-sensitive area of cells 21 directly and instead will be effectively absorbed by the parabolic and the inclined planar light reflectors 18 and 20. The probability of a backscattered electron reaching a photo-sensitive cell 21 is less than 1.6% for a gallium arsenide semiconductor specimen The mechanically integrated structure forming this invention can be repeatedly mounted and removed from an electron microscope vacuum chamber specimen stage without the requirement of any modifications, thus providing great flexibility in adapting to standard electron microscopes.

Having thus shown and described what is considered to be the preferred embodiment for implementing the subject invention, it is to be noted that the same has been made by way of illustration and not limitation. Accordingly, all modifications, alterations and changes coming within the spirit and scope of the invention as set forth in the appended claims are herein meant to be included.

We claim:

1. Cathodoluminescence detector apparatus for the vacuum chamber specimen stage of an electron microscope being used for cathodoluminescence microscopy and analysis, comprising:

a) an adaptor unit for mounting the apparatus on said vacuum chamber specimen stage and having means for supporting a specimen;

b) at least one photosensitive member responsive to radiation emitted from a specimen being scanned by an electron beam of the electron microscope;

c) means secured to said adaptor unit for supporting said at least one photosensitive member;

d) means for coupling a detection signal from said at least one photosensitive member;

e) double reflecting means located adjacent said specimen and said at least one photosensitive member and having respective reflective surfaces for reflecting radiation emitted from said specimen to said photosensitive member and collecting backscattered electrons from said specimen for removal, said double reflecting means further comprising, f) parabolic reflector means for receiving the radiation from said specimen, and g) planar reflector means for receiving the radiation from said first reflector means and then directing the reflected radiation to said photosensitive member.

2. The apparatus of claim 1 wherein said planar reflector comprises a pyramidal structure having a plurality of inclined reflective surfaces disposed to the side of said adaptor unit and wherein said parabolic reflector has a concave reflective surface disposed toward said plurality of inclined reflective surfaces and said specimen.

3. The apparatus of claim 2 wherein said at least one photosensitive member comprises a plurality of photosensitive members arranged in quadrature around said adaptor unit and facing said inclined reflective surfaces.

4. The apparatus of claim 2 wherein said parabolic reflector means includes an aperture for permitting the electron beam to impinge on said specimen.

5. The apparatus of claim 4 wherein said aperture comprises a central aperture.

6. The apparatus of claim 5 and additionally including electrical insulator means located between said at least one photosensitive member and said means for supporting said photosensitive member.

7. The apparatus of claim 3 wherein said plurality of photosensitive members are arranged in an upright position and facing said inclined reflective surfaces at an angle of substantially 45°.

8. The apparatus of claim 1 wherein said adaptor unit comprises a first body member for supporting said specimen, a second body member for supporting said means for supporting said at least one photosensitive member and a third body member projecting from said second body member for attachment to said vacuum chamber specimen stage.

9. The apparatus of claim 8 wherein said first body member includes means for receiving a specimen stub which operates to support said specimen.

10. The apparatus of claim 9 wherein said means for receiving the specimen stub comprises a threaded bore.

11. The apparatus of claim 8 wherein said third body member comprises a threaded stud.

12. The apparatus of claim 6 wherein said means for supporting said at least one photosensitive member and said electrical insulator means includes at least one mutually aligned hole therein for connecting said means for coupling a detection signal to the underside surface of said at least one photosensitive member.

13. The apparatus of claim 1 additionally including means for attaching said parabolic reflector means to said means for supporting said at least one photosensitive member.

14. The apparatus of claim 13 wherein said means for attaching comprises means for securing a peripheral edge of said parabolic reflector means to said means for supporting said at least one photosensitive means.

* * * * *

UNITED STATES PATENT AND TRADEMARK OFFICE
CERTIFICATE OF CORRECTION

PATENT NO. : 5,468,967

DATED : November 21, 1995

INVENTOR(S) : Daniel S. H. Chan; Kin Leong Pey; Jacob C. H. Phang

It is certified that error appears in the above-indentified patent and that said Letters Patent is hereby corrected as shown below:

On the title page:
at (75) Inventors, add the surname "Pey" to "Kin Leong", the second named inventor.

Signed and Sealed this

Twenty-third Day of January, 1996

*Attest:*

BRUCE LEHMAN

*Attesting Officer*   *Commissioner of Patents and Trademarks*